(12) United States Patent
Suda

(10) Patent No.: US 12,206,366 B2
(45) Date of Patent: Jan. 21, 2025

(54) HARMONIC PROCESSING CIRCUIT AND AMPLIFIER

(71) Applicant: SUMITOMO ELECTRIC INDUSTRIES, LTD., Osaka (JP)

(72) Inventor: Noriyoshi Suda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 746 days.

(21) Appl. No.: 17/423,171

(22) PCT Filed: Oct. 28, 2019

(86) PCT No.: PCT/JP2019/042186
§ 371 (c)(1),
(2) Date: Jul. 15, 2021

(87) PCT Pub. No.: WO2020/158080
PCT Pub. Date: Aug. 6, 2020

(65) Prior Publication Data
US 2022/0131504 A1   Apr. 28, 2022

(30) Foreign Application Priority Data
Jan. 29, 2019  (JP) ................. 2019-012992

(51) Int. Cl.
*H03F 1/07* (2006.01)
*H03F 1/02* (2006.01)
*H03F 1/56* (2006.01)
*H03F 3/60* (2006.01)

(52) U.S. Cl.
CPC ............. *H03F 1/07* (2013.01); *H03F 1/0288* (2013.01); *H03F 1/565* (2013.01); *H03F 3/601* (2013.01)

(58) Field of Classification Search
CPC .................. H03F 1/07; H03F 1/0288
See application file for complete search history.

(56) References Cited

U.S. PATENT DOCUMENTS

| | | | |
|---|---|---|---|
| 2004/0041634 A1 | 3/2004 | Sugiura | |
| 2008/0252382 A1* | 10/2008 | Takagi | H03F 3/217 330/302 |
| 2009/0039962 A1* | 2/2009 | Uno | H03F 1/56 330/286 |
| 2010/0019849 A1* | 1/2010 | Knickerbocker | H03F 3/193 330/277 |
| 2012/0098598 A1* | 4/2012 | Uno | H03F 1/56 330/277 |
| 2012/0169431 A1 | 7/2012 | Kuroda et al. | |

(Continued)

FOREIGN PATENT DOCUMENTS

| | | |
|---|---|---|
| JP | 03-114307 A | 5/1991 |
| JP | 05-191171 A | 7/1993 |

(Continued)

*Primary Examiner* — Patricia T Nguyen
(74) *Attorney, Agent, or Firm* — Volpe Koenig

(57) ABSTRACT

A harmonic processing circuit includes: a feeder line configured to feed power to an amplifying device; and a harmonic processing unit connected to the feeder line, and configured to perform harmonic processing to a harmonic of a signal outputted from the amplifying device. The feeder line is connected to a fundamental wave matching circuit that is connected to the amplifying device and performs matching with respect to a fundamental wave of the signal.

2 Claims, 9 Drawing Sheets

(56) References Cited

U.S. PATENT DOCUMENTS

| | | | |
|---|---|---|---|
| 2013/0076444 A1* | 3/2013 | Aikawa | H03F 3/245 330/277 |
| 2015/0365057 A1* | 12/2015 | Kaczman | H03F 3/245 330/296 |
| 2016/0204744 A1 | 7/2016 | Kimura | |
| 2020/0397506 A1* | 12/2020 | Hancock | H03F 1/56 |
| 2022/0200551 A1* | 6/2022 | Samata | H01L 24/14 |

FOREIGN PATENT DOCUMENTS

| | | |
|---|---|---|
| JP | 05-191176 A | 7/1993 |
| JP | 2004-096379 A | 3/2004 |
| JP | 2011-066839 A | 3/2011 |
| JP | 2016-127565 A | 7/2016 |
| WO | 2017/122271 A1 | 7/2017 |

\* cited by examiner ary processing at a harmonic frequency of a signal outputted from the amplifying device. The feeder line is connected to a fundamental wave matching circuit that is connected to the amplifying device and performs matching at a fundamental wave frequency of the signal.

HARMONIC PROCESSING CIRCUIT AND AMPLIFIER

TECHNICAL FIELD

The present invention relates to a harmonic processing circuit and an amplifier.

This application claims priority on Japanese Patent Application No. 2019-012992 filed on Jan. 29, 2019, the entire content of which is incorporated herein by reference.

BACKGROUND ART

Conventionally, in order to perform harmonic processing for improving power efficiency of an amplifier, a harmonic processing circuit including an open stub for appropriately adjusting an impedance at a harmonic frequency is generally provided to a signal line (see Patent Literature 1, for example).

CITATION LIST

Patent Literature

PATENT LITERATURE 1: Japanese Laid-Open Patent Publication No. 2011-66839

SUMMARY OF INVENTION

A harmonic processing circuit according to one embodiment includes: a feeder line configured to feed power to an amplifying device; and a harmonic processing unit connected to the feeder line, and configured to perform harmonic processing at a harmonic frequency of a signal outputted from the amplifying device. The feeder line is connected to a fundamental wave matching circuit that is connected to the amplifying device and performs matching at a fundamental wave frequency of the signal.

An amplifier according to another embodiment includes: an amplifying device; a feeder line configured to feed power to the amplifying device; and a harmonic processing unit connected to the feeder line, and configured to perform harmonic processing at a harmonic frequency of a signal outputted from the amplifying device. The feeder line is connected to a fundamental wave matching circuit that is connected to the amplifying device and performs matching at a fundamental wave frequency of the signal.

DESCRIPTION OF EMBODIMENTS

Problems to be Solved by the Present Disclosure

The size of the open stub included in the harmonic processing circuit is determined based on the wavelength of a signal to be processed. That is, since the open stub needs to have a certain size that is ensured, it is difficult to miniaturize the open stub.

A feeder line for feeding power to a gate terminal and a drain terminal is connected to an amplifying device included in an amplifier, and it is conceivable to provide a harmonic processing circuit to the feeder line. In this case, since the harmonic processing circuit is provided not to a new feeder line but to the existing feeder line, it is possible to miniaturize the circuit.

Generally, a feeder line is connected to an input/output terminal of the amplifying device. In addition, a fundamental wave matching circuit that performs matching of a fundamental wave included in the signal, is connected to the input/output terminal of the amplifying device.

Figure 8:
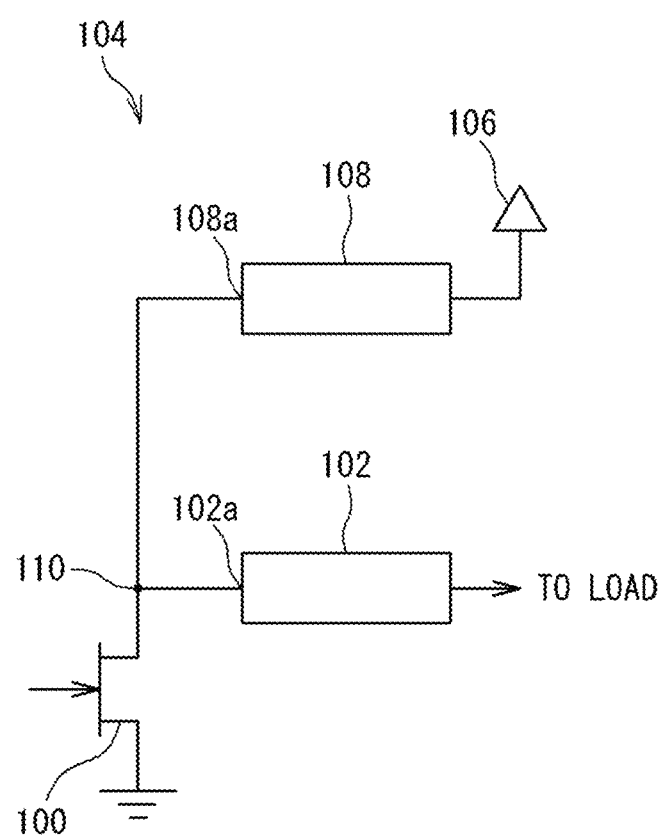
FIG. 8 shows a circuit in which a harmonic processing circuit is provided to a feeder line.

FIG. 8 shows a circuit in which a harmonic processing circuit is provided to a feeder line. In FIG. 8, a fundamental wave matching circuit 102 that performs impedance matching of a fundamental wave included in a signal outputted from an amplifying device 100, is connected to a drain terminal of the amplifying device 100.

A feeder line 104 connects the drain terminal of the amplifying device 100 to a DC power supply 106. A harmonic processing unit 108 that performs harmonic processing for the signal is connected to the feeder line 104.

The fundamental wave matching circuit 102 and the harmonic processing unit 108 convert an impedance (load impedance) when a load side connected to the amplifying device 100 is viewed from the amplifying device 100, into a desired impedance. The desired load impedance to be achieved through the conversion by the fundamental wave matching circuit 102 and the harmonic processing unit 108 needs to be appropriately set so that the amplifying device 100 has high efficiency.

The load impedance as viewed from the amplifying device 100 is defined as a combined impedance of an impedance when a terminal 108a of the harmonic processing unit 108 is viewed from a connection portion 110, and an impedance when a terminal 102a of the fundamental wave matching circuit 102 is viewed from the connection portion 110.

Since the fundamental wave matching circuit 102 is set so as to optimize the load impedance at the fundamental wave frequency of the amplifying device 100, the load impedance at the harmonic frequency may not necessarily be considered.

Therefore, the impedance at the harmonic frequency at the terminal 108a of the harmonic processing unit 108 needs to be appropriately set in accordance with the impedance at the harmonic frequency at the terminal 102a of the fundamental wave matching circuit 102.

Since the load impedance at the harmonic frequency in the fundamental wave matching circuit 102 is not considered in the fundamental wave matching circuit 102, the impedance at the harmonic frequency when the terminal 102a of the fundamental wave matching circuit 102 is viewed from the connection portion 110 may be almost short-circuited.

When the impedance of the harmonic frequency when the terminal 102a of the fundamental wave matching circuit 102 is viewed from the connection portion 110 is almost short-circuited, the fundamental wave matching circuit 102 has more influence on the combined impedance than the harmonic processing unit 108. Therefore, even if the harmonic processing unit 108 is adjusted to change the impedance at the harmonic frequency at the terminal 108a, it may be difficult to adjust the load impedance at the harmonic frequency as viewed from the amplifying device 100 to a desired value.

That is, when the impedance at the harmonic frequency of the fundamental wave matching circuit 102 as viewed from the connection portion 110 to which the harmonic processing unit 108 is connected is almost short-circuited, it may be difficult to adjust, by the harmonic processing unit 108, the load impedance at the harmonic frequency as viewed from the amplifying device 100.

Figure 9A:
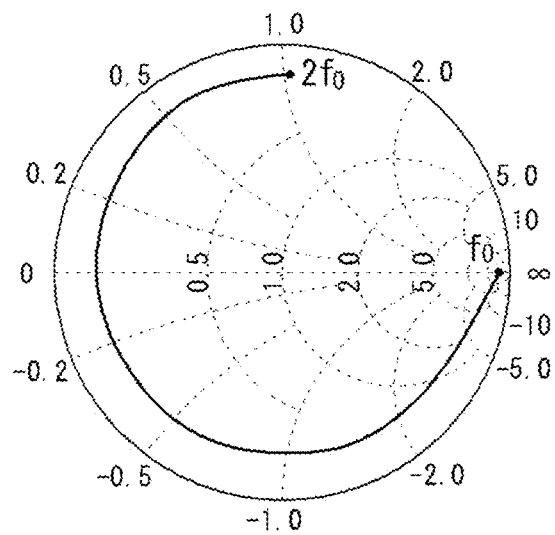
FIG. 9A is a Smith chart showing an impedance when a terminal of a harmonic processing unit is viewed from a connection portion.
Figure 9B:
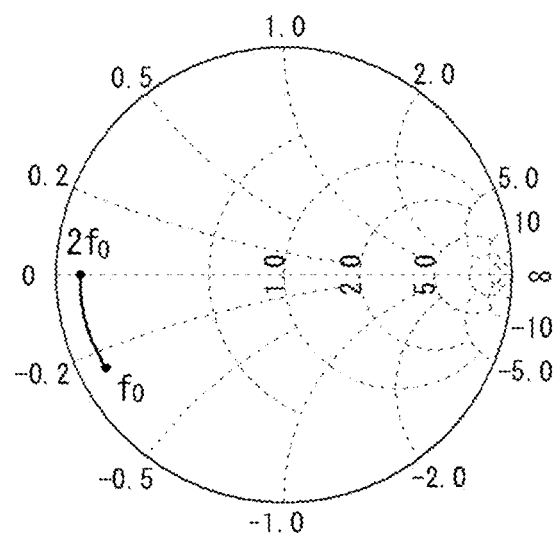
FIG. 9B is a Smith chart showing an impedance when a terminal of the fundamental wave matching circuit is viewed from the connection portion.
Figure 9C:
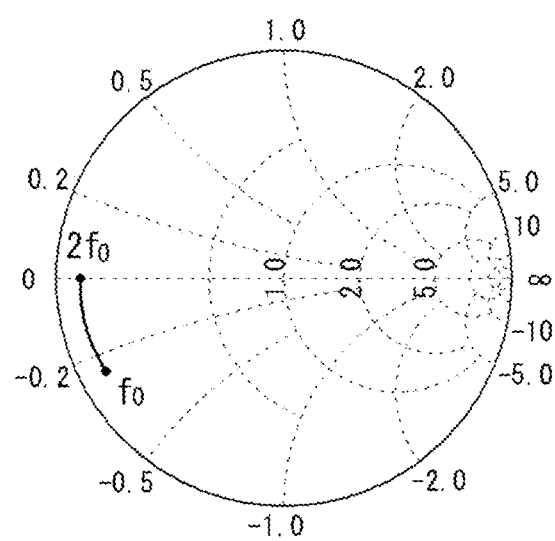
FIG. 9C is a Smith chart showing an impedance (load impedance) when the connection portion is viewed from the amplifying device.

FIG. 9A is a Smith chart showing an impedance when the terminal 108a of the harmonic processing unit 108 is viewed from the connection portion 110, FIG. 9B is a Smith chart showing an impedance when the terminal 102a of the fundamental wave matching circuit 102 is viewed from the connection portion 110, and FIG. 9C is a Smith chart showing an impedance (load impedance) when the connection portion 110 is viewed from the amplifying device 100.

FIG. 9A to FIG. 9C each show an impedance when the frequency of a signal is varied from a fundamental wave frequency $f_0$ to a second harmonic frequency $2f_0$.

As shown in FIG. 9B, the impedance at the second harmonic frequency $2f_0$ in the fundamental wave matching circuit 102 is almost short-circuited.

Meanwhile, as shown in FIG. 9C, the load impedance as viewed from the amplifying device 100 is almost the same as the impedance shown in FIG. 9B.

This means that the load impedance as viewed from the amplifying device 100 is not influenced by the harmonic processing unit 108.

As described above, when the impedance at the second harmonic frequency $2f_0$ in the fundamental wave matching circuit 102 as viewed from the connection portion 110 is almost short-circuited, even if the impedance at the second harmonic frequency $2f_0$ in the harmonic processing unit 108 is changed, it may be difficult to adjust the impedance at the second harmonic frequency $2f_0$ as viewed from the amplifying device 100.

This may prevent harmonic processing from being appropriately performed.

The present disclosure has been made in view of the above situation, and an object of the present disclosure is to provide a harmonic processing circuit and an amplifier capable of appropriately performing harmonic processing.

Effects of the Present Disclosure

According to the present disclosure, harmonic processing can be appropriately performed.

First, contents of embodiments of the present disclosure are listed and described.

Outline of Embodiments (1) A harmonic processing circuit according to one embodiment includes: a feeder line configured to feed power to an amplifying device; and a harmonic processing unit connected to the feeder line, and configured to perform harmonic processing at a harmonic frequency of a signal outputted from the amplifying device. The feeder line is connected to a fundamental wave matching circuit that is connected to the amplifying device and performs matching at a fundamental wave frequency of the signal.

According to the harmonic processing circuit having the above configuration, since the feeder line is connected to the fundamental wave matching circuit, the feeder line can be connected to any position within a line length in the fundamental wave matching circuit.

Therefore, an impedance at the harmonic frequency when the fundamental wave matching circuit is viewed from a connection point to which the feeder line is connected, can be adjusted so as not to be short-circuited.

As a result, the load impedance at the harmonic frequency when the load side is viewed from the amplifying device can be adjusted by the impedance at the harmonic frequency set in the harmonic processing unit, whereby harmonic processing can be appropriately performed.

(2) In the above harmonic processing circuit, the fundamental wave matching circuit preferably includes a first line having one end connected to the amplifying device, and a second line connected to the other end of the first line. The feeder line is preferably connected to a connection portion that connects the first line and the second line.

In this case, the impedance at the harmonic frequency when the second line is viewed from the connection point can be adjusted so as not to be short-circuited, by adjusting the line length of the first line.

(3) In the above harmonic processing circuit, assuming that a wavelength of a fundamental wave of the signal is $\lambda$, the first line preferably has a line length not shorter than $\lambda/16$ and not longer than $3\lambda/16$.

In this case, the phase angle of an impedance at a second harmonic when the second line is viewed from the connection point can be changed by about 90 degrees to about 270 degrees with respect to an impedance at the second harmonic when the fundamental wave matching circuit is viewed from the amplifying device.

Therefore, the impedance at the harmonic frequency when the second line is viewed from the connection point can be reliably adjusted so as not to be short-circuited, by setting the line length of the first line within the above range.

(4) In the above harmonic processing circuit, the fundamental wave matching circuit preferably includes a signal line having one end connected to the amplifying device. The feeder line is preferably connected to a position in the signal line whose line length from the one end of the signal line is a predetermined length.

In this case, the impedance at the harmonic frequency when the other end side of the signal line is viewed from a connection point of the feeder line can be adjusted so as not to be short-circuited, by adjusting the position of the connection point of the feeder line.

(5) In the above harmonic processing circuit, assuming that a wavelength of a fundamental wave of the signal is $\lambda$, the predetermined length is preferably not shorter than $\lambda/16$ and not longer than $3\lambda/16$.

In this case, for example, the phase angle of the impedance at the second harmonic when the other end side of the signal line is viewed from the connection point of the feeder line can be changed by about 90 degrees to about 270 degrees with respect to the impedance at the second harmonic when the fundamental wave matching circuit is viewed from the amplifying device.

Therefore, the impedance at the harmonic frequency when the other end side of the signal line is viewed from the connection point can be reliably adjusted so as not to be short-circuited.

(6) An amplifier according to another embodiment includes: an amplifying device; a feeder line configured to feed power to the amplifying device; and a harmonic processing unit connected to the feeder line, and configured to perform harmonic processing at a harmonic frequency of a signal outputted from the amplifying device. The feeder line is connected to a fundamental wave matching circuit that is connected to the amplifying device and performs matching at a fundamental wave frequency of the signal.

Details of Embodiments

Hereinafter, preferred embodiments will be described with reference to the drawings. It should be noted that at least some parts of the embodiments described below may be combined together as desired.

Configuration of Doherty Amplifier

Figure 1:
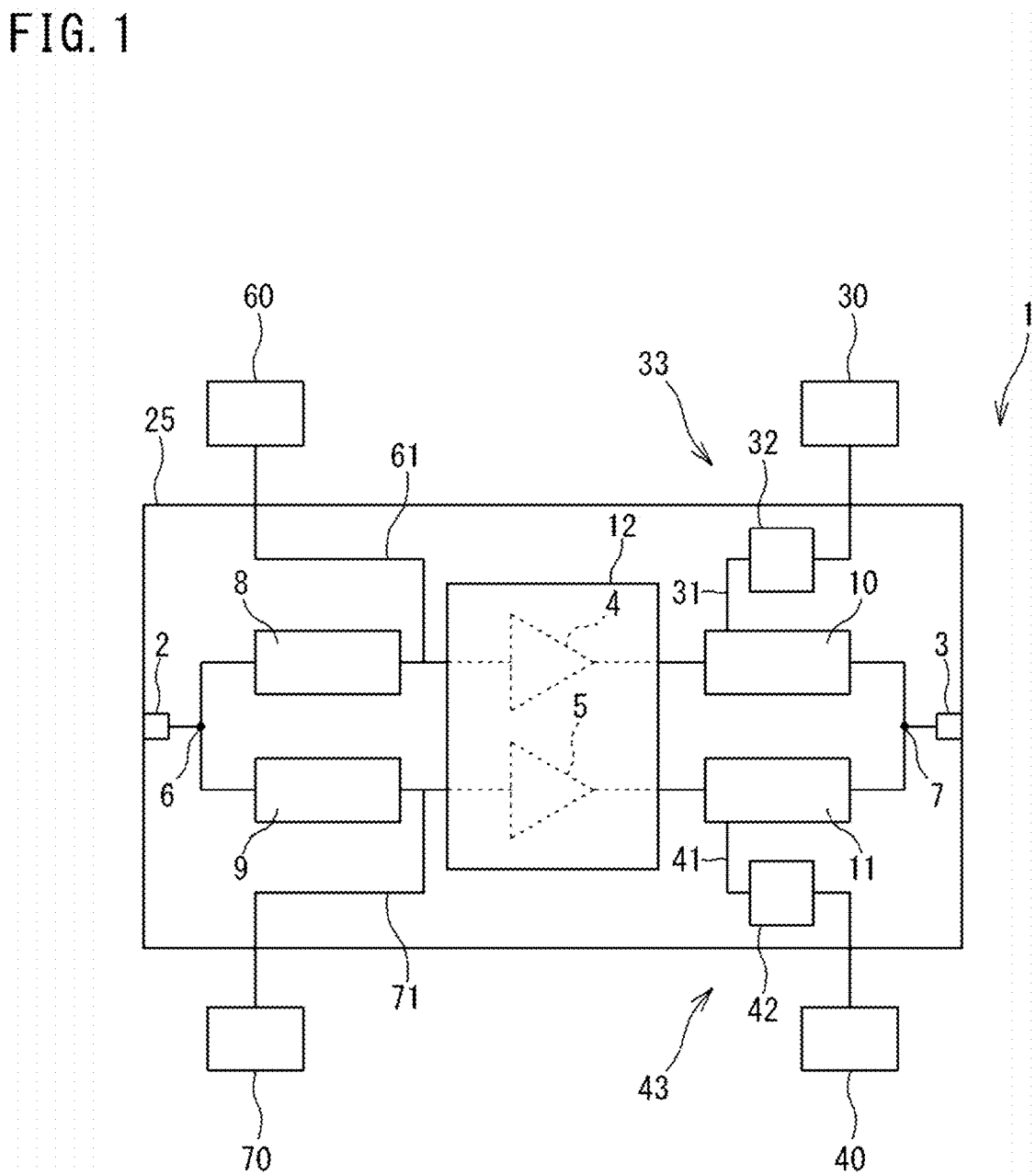
FIG. 1 is a block diagram showing a configuration of a Doherty amplifier according to an embodiment.

FIG. 1 is a block diagram showing the configuration of a Doherty amplifier according to an embodiment.

The Doherty amplifier 1 is mounted on a wireless communication apparatus such as a base station apparatus in a mobile communication system, and amplifies a transmission signal having a radio frequency (RF signal).

The Doherty amplifier 1 amplifies an RF signal (input signal) provided to an input terminal 2, and outputs a resultant signal from an output terminal 3.

As shown in FIG. 1, the Doherty amplifier 1 includes a carrier amplifier 4, a peak amplifier 5 connected in parallel to the carrier amplifier 4, a distributor 6, a combiner 7 that combines outputs from the carrier amplifier 4 and the peak amplifier 5, a carrier-side input matching circuit 8, a peak-side input matching circuit 9, a carrier-side output matching circuit 10, and a peak-side output matching circuit 11.

The distributor 6 is connected to a stage subsequent to the input terminal 2, and distributes the RF signal provided from the input terminal 2 to the carrier amplifier 4 and the peak amplifier 5.

An output from the distributor 6 is provided to the carrier amplifier 4 via the carrier-side input matching circuit 8, and to the peak amplifier 5 via the peak-side input matching circuit 9.

The carrier-side input matching circuit 8 performs impedance matching at a frequency of a fundamental wave included in an input to the carrier amplifier 4, between the distributor 6 side and the carrier amplifier 4 side. The peak-side input matching circuit 9 performs impedance matching at a frequency of a fundamental wave included in an input to the peak amplifier 5, between the distributor 6 side and the peak amplifier 5 side.

The carrier amplifier 4 is an amplifying device for constantly amplifying an input signal provided thereto. Meanwhile, the peak amplifier 5 is an amplifying device for amplifying an input signal when the power of the input signal becomes equal to or higher than a predetermined value. Each of the carrier amplifier 4 and the peak amplifier 5 is, for example, a high electron mobility transistor (HEMT) using gallium nitride (GaN).

The carrier amplifier 4 and the peak amplifier 5 are mounted on an integrated circuit, and are housed in a package 12.

An output from the carrier amplifier 4 is provided to the combiner 7 via the carrier-side output matching circuit 10.

An output from the peak amplifier 5 is provided to the combiner 7 via the peak-side output matching circuit 11.

The carrier-side output matching circuit 10 is a circuit for converting an impedance (load impedance) when the combiner 7 side, which is a load side, is viewed from the carrier amplifier 4, into a desired impedance. The carrier-side output matching circuit 10 performs impedance matching for converting the load impedance into the desired impedance, with respect to a frequency of a fundamental wave of a signal outputted from the carrier amplifier 4.

The peak-side output matching circuit 11 is a circuit for converting an impedance (load impedance) when the combiner 7 side, which is a load side, is viewed from the peak amplifier 5, into a desired impedance. The peak-side output matching circuit 11 performs impedance matching with respect to a frequency of a fundamental wave outputted from the peak amplifier 5.

The combiner 7 combines the output from the carrier amplifier 4 and the output from the peak amplifier 5. The combiner 7 provides the combined output as an output signal to the output terminal 3.

The output terminal 3 outputs the output signal provided from the combiner 7.

The package 12 housing the amplifiers 4, 5, the input and output terminals 2, 3, the distributor 6, the combiner 7, and the matching circuits 8, 9, 10, and 11 are mounted on a circuit board 25.

A first drain power supply 30, a second drain power supply 40, a first gate power supply 60, and a second gate power supply 70, which are disposed outside the circuit board 25, are connected to the Doherty amplifier 1.

The first drain power supply 30 is a DC power supply for supplying power to a drain terminal of the carrier amplifier 4, and is connected to the carrier-side output matching circuit 10 via a first feeder line 31.

The second drain power supply 40 is a DC power supply for supplying power to a drain terminal of the peak amplifier 5, and is connected to the peak-side output matching circuit 11 via a second feeder line 41.

The first gate power supply 60 is a DC power supply for supplying power to a gate terminal of the carrier amplifier 4, and is connected to the gate terminal of the carrier amplifier 4 via a third feeder line 61.

The second gate power supply 70 is a DC power supply for supplying power to a gate terminal of the peak amplifier 5, and is connected to the gate terminal of the peak amplifier 5 via a fourth feeder line 71.

A first harmonic processing unit 32 having a function of performing harmonic processing at a frequency of a harmonic included in the output from the carrier amplifier 4 is connected to the first feeder line 31.

A second harmonic processing unit 42 having a function of performing harmonic processing at a frequency of a harmonic included in the output from the peak amplifier 5 is connected to the second feeder line 41.

The first feeder line 31 and the first harmonic processing unit 32 connected to the first feeder line 31 form a first harmonic processing circuit 33.

The first harmonic processing circuit 33 is a circuit for converting a load impedance at a harmonic frequency when the combiner 7 side, which is a load side, is viewed from the carrier amplifier 4, into a desired impedance. A process of converting a load impedance at a harmonic frequency into a desired impedance is harmonic processing.

The second feeder line 41 and the second harmonic processing unit 42 connected to the second feeder line 41 form a second harmonic processing circuit 43.

Like the first harmonic processing circuit 33, the second harmonic processing circuit 43 is a circuit for converting a load impedance at a harmonic frequency when the combiner 7 side, which is a load side, is viewed from the peak amplifier 5, into a desired impedance.

Figure 2:
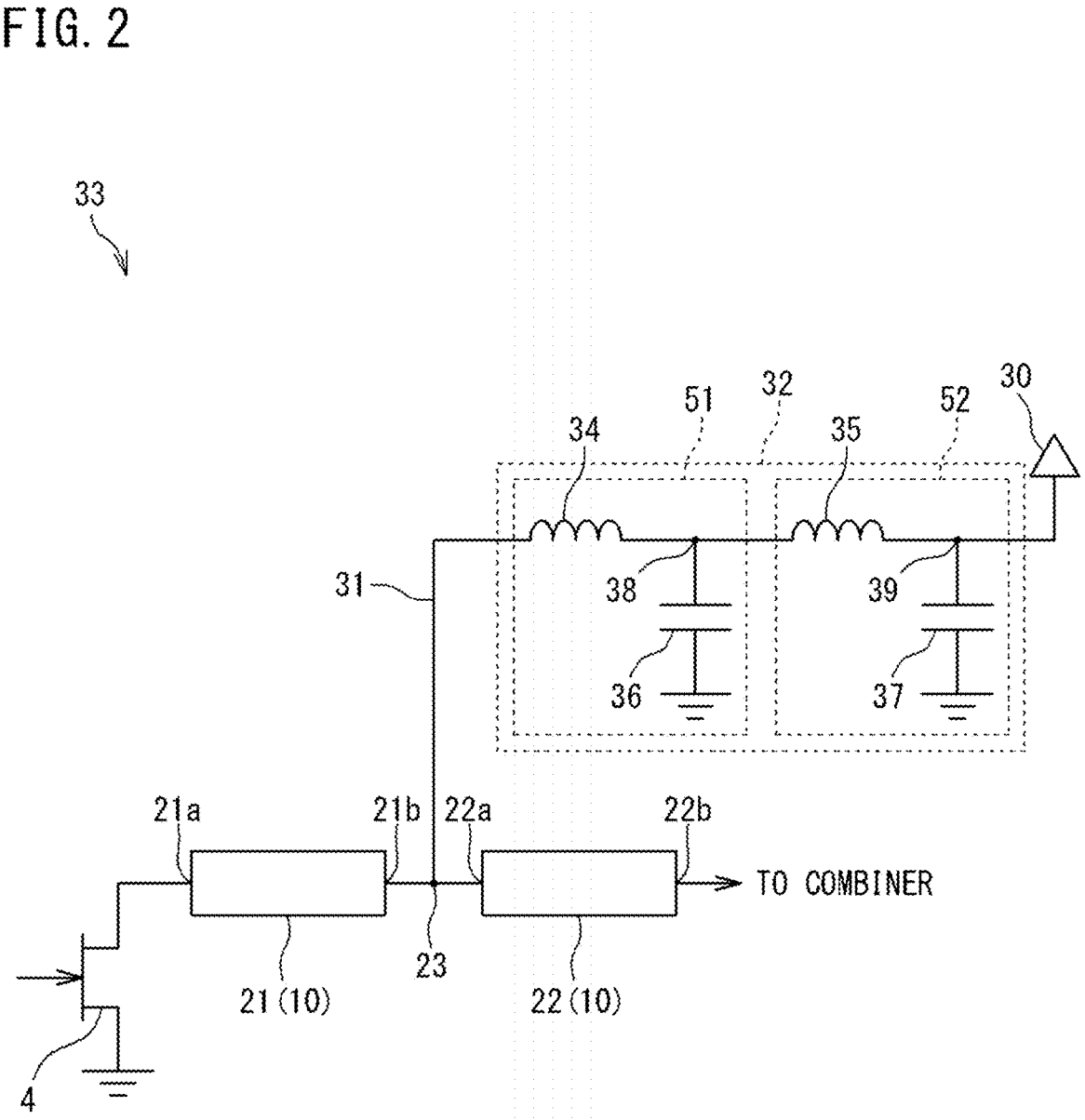
FIG. 2 is a block diagram showing a configuration of a first harmonic processing circuit.

FIG. 2 is a block diagram showing the configuration of the first harmonic processing circuit 33. The configuration of the second harmonic processing circuit 43 is identical to that of the first harmonic processing circuit 33. Therefore, only the first harmonic processing circuit 33 will be described.

As shown in FIG. 2, the first harmonic processing circuit 33 is configured to include the first feeder line 31 and the first harmonic processing unit 32.

The first harmonic processing unit 32 is configured to include a first inductance element 34, a second inductance element 35, a first capacitance element 36, and a second capacitance element 37.

The respective elements 34, 35, 36, and 37 are lumped elements connected to the first feeder line 31, and the first harmonic processing unit 32 is configured to include a lumped-element circuit.

The first inductance element 34 and the second inductance element 35 are connected to the first feeder line 31 in series.

One end of the first capacitance element 36 is connected to a connection point 38 between the first inductance element 34 and the second inductance element 35, and the other end thereof is grounded.

One end of the second capacitance element 37 is connected to a connection point 39 between the second inductance element 35 and the first drain power supply 30, and the other end thereof is grounded.

Thus, the first harmonic processing unit 32 is configured to include a first LC circuit 51 including the first inductance element 34 and the first capacitance element 36, and a second LC circuit 52 including the second inductance element 35 and the second capacitance element 37. That is, the first harmonic processing unit 32 is configured by connecting two stages of LC circuits. This configuration enables processing for a second harmonic.

As described above, at least a part of the first harmonic processing unit 32 (second harmonic processing unit 42) for setting a load impedance at a harmonic frequency is configured by using a lumped-element circuit. Therefore, the size of the first harmonic processing unit 32 (second harmonic processing unit 42) can be reduced as compared to, for example, the case where harmonic processing is performed using an open stub, thereby realizing miniaturization of the entire circuit.

Moreover, in the present embodiment, the first harmonic processing circuit 33 (second harmonic processing circuit 43) is provided by connecting the first harmonic processing unit 32 (second harmonic processing unit 42) to the first feeder line 31 (second feeder line 41). Therefore, the first harmonic processing circuit 33 (second harmonic processing circuit 43) can be provided without adding a new line.

Therefore, even if the harmonic processing circuit is provided to the Doherty amplifier 1 having the amplifiers 4, 5, the Doherty amplifier 1 is inhibited from being increased in size due to the provision of the harmonic processing circuit.

In the present embodiment, the first harmonic processing unit 32 (second harmonic processing unit 42) is set such that the first feeder line 31 (second feeder line 41) is open with respect to the fundamental wave.

In this case, an influence of the first harmonic processing unit 32 (second harmonic processing unit 42) on the fundamental wave can be reduced.

In the present embodiment, the first harmonic processing unit 32 includes a plurality of (two) capacitance elements 36, 37 connected in parallel. Of the capacitance elements 36, 37, the second capacitance element 37, which is connected to a position adjacent to the first drain power supply 30, is set to have a capacitance that causes a short circuit with respect to the fundamental wave.

Thus, a high frequency signal is prevented from leaking to the power supply side of the feeder line.

In the present embodiment, an inductance of the second inductance element 35 is set to a value greater than an inductance of the first inductance element 34, and a capacitance of the second capacitance element 37 is set to a value greater than a capacitance of the first capacitance element 36.

Through setting that satisfies the above relationship, the values of the respective elements can be appropriately set while satisfying the capacitance of the second capacitance element 37 and the other conditions.

The capacitance of the first capacitance element 36 is set to an extremely small value in some cases.

Therefore, the first capacitance element 36 is not connected between the first inductance element 34 and the second inductance element 35 in some cases.

As shown in FIG. 2, the first feeder line 31 of the present embodiment is connected to the carrier-side output matching circuit 10.

The carrier-side output matching circuit 10 is configured to include a first line 21 and a second line 22.

One end 21a of the first line 21 is connected to the carrier amplifier 4. The other end 21b of the first line 21 is connected to one end 22a of the second line 22.

The other end of the second line 22 is connected to the combiner 7.

The first feeder line 31 is connected to a connection portion 23 that connects the first line 21 to the second line 22.

While the harmonic processing circuit 33 is connected to the carrier-side output matching circuit 10 in the present embodiment, a case where the harmonic processing circuit 33 is connected to the drain terminal of the carrier amplifier 4 is considered.

In this case, assuming that an impedance at a second harmonic frequency when (the one end 21a of) the carrier-side output matching circuit 10 is viewed from the connection portion (the drain terminal of the carrier amplifier 4) of the harmonic processing circuit 33 is almost short-circuited, even if the impedance at the harmonic frequency to be converted by the first harmonic processing circuit 33 is changed by adjusting the first harmonic processing unit 32, it is difficult in some cases to adjust the load impedance viewed from the carrier amplifier 4 to a desired value.

In this regard, according to the above configuration, the first feeder line 31 can be connected to any position within the line length in the carrier-side output matching circuit 10, by changing the line lengths of the first line 21 and the second line 22.

Therefore, the impedance at the harmonic frequency when the carrier-side output matching circuit 10 is viewed from the connection portion 23 to which the first feeder line 31 (harmonic processing circuit 33) is connected, can be adjusted so as not to be short-circuited.

As a result, the load impedance at the harmonic frequency when the load side is viewed from the carrier amplifier 4 can be adjusted by the impedance at the harmonic frequency set in the first harmonic processing unit 32.

Thus, harmonic processing can be appropriately performed.

Moreover, in the above configuration, since the first feeder line 31 is connected to the connection portion 23, even if the impedance with respect to the harmonic at the one end 21a of the carrier-side output matching circuit 10 as viewed from the carrier amplifier 4 is almost short-circuited, the impedance at the harmonic frequency when the one end 22a of the second line 22 is viewed from the connection portion 23 can be adjusted so as not to be short-circuited, by adjusting the line length of the first line 21.

Assuming that the wavelength of the fundamental wave is $\lambda$, the line length of the first line 21 is set within a range not shorter than $\lambda/16$ and not longer than $3\lambda/16$.

Thus, the phase angle of the impedance with respect to the second harmonic in the carrier-side output matching circuit 10 can be changed within a range from about 90 degrees to about 270 degrees.

Therefore, if the line length of the first line 21 is set within the aforementioned range, it is possible to reliably perform an adjustment such that the impedance at the harmonic frequency when the second line 22 is viewed from the connection portion 23 is not short-circuited.

FIG. 3A, FIG. 3B, FIG. 4A, and FIG. 4B are Smith charts showing an example of impedances in the respective components of the carrier-side output matching circuit 10 shown in FIG. 2. FIG. 3A, FIG. 3B, FIG. 4A, and FIG. 4B each show an impedance change corresponding to frequencies from the fundamental wave frequency $f_0$ to the second harmonic frequency $2f_0$.

Figure 3A:
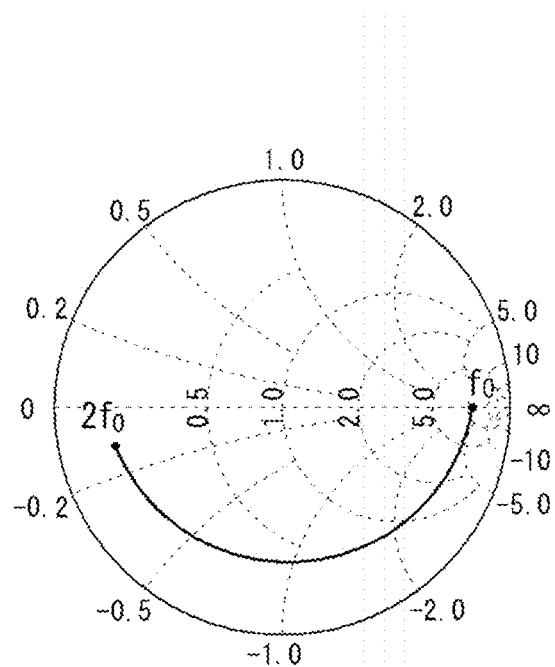
FIG. 3A is a Smith chart showing an impedance when the harmonic processing circuit is viewed from a connection portion.
Figure 3B:
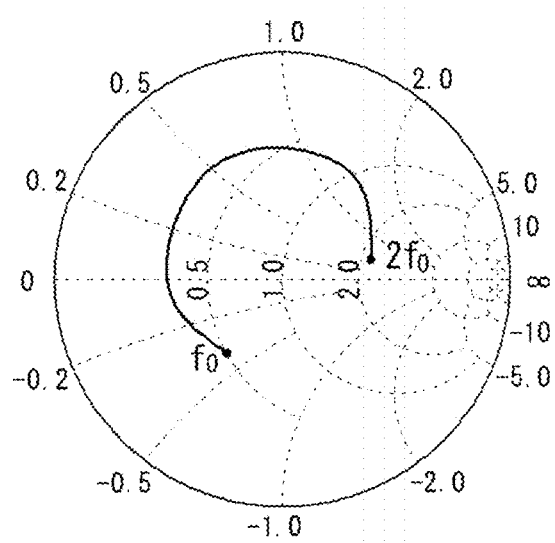
FIG. 3B is a Smith chart showing an impedance when one end of a second line is viewed from the connection portion.

FIG. 3A shows an impedance when the harmonic processing circuit 33 is viewed from the connection portion 23, and FIG. 3B shows an impedance when the one end 22a of the second line 22 is viewed from the connection portion 23.

In FIG. 3A, the impedance at the fundamental wave frequency $f_0$ is almost open as described above.

In FIG. 3B, the impedance at the second harmonic frequency $2f_0$ is almost open.

It is assumed that the carrier-side output matching circuit 10 of the present embodiment is set such that, for example, if the harmonic processing circuit 33 is connected to the drain terminal of the carrier amplifier 4, the impedance at the second harmonic frequency $2f_0$ as viewed from the connection portion of the harmonic processing circuit 33 will be short-circuited. Even if the carrier-side output matching circuit 10 is set as described above, since the first feeder line 31 can be connected to any position within the line length in the carrier-side output matching circuit 10 according to the present embodiment, the impedance at the harmonic frequency when (the one end 21a of) the carrier-side output matching circuit 10 is viewed from the connection portion 23, can be adjusted so as not to be short-circuited.

Figure 4A:
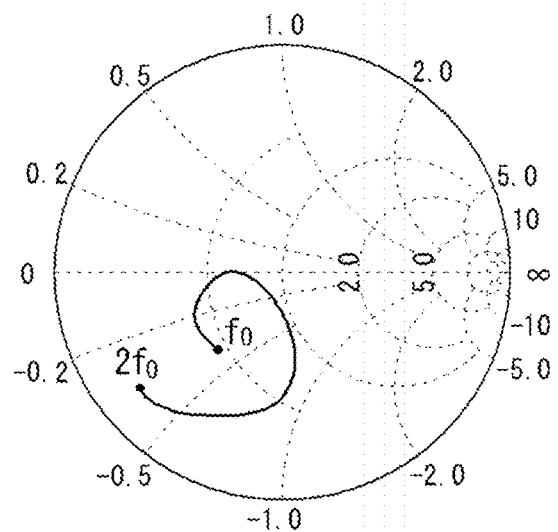
FIG. 4A is a Smith chart showing an impedance when the connection portion is viewed from the other end of a first line.
Figure 4B:
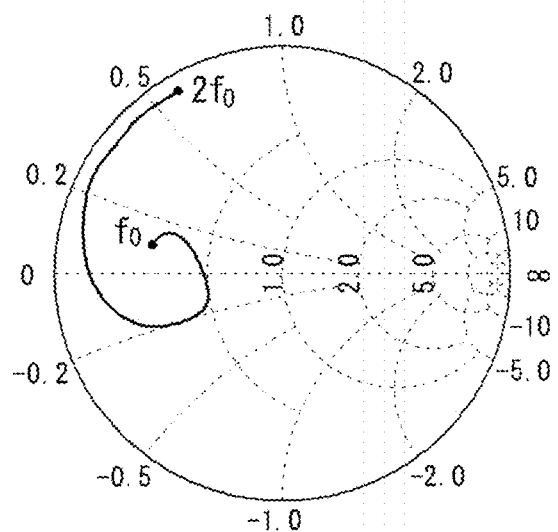
FIG. 4B is a Smith chart showing an impedance when an end of a carrier-side output matching circuit is viewed from an amplifying device.

FIG. 4A shows an impedance when the connection portion 23 is viewed from the other end 21b of the first line 21, and FIG. 4B shows an impedance when the one end 21a of the carrier-side output matching circuit 10 is viewed from the carrier amplifier 4.

When the impedance shown in FIG. 4A is compared with the impedance shown in FIG. 3A, these impedances have different characteristics. When the impedance shown in FIG. 4B is compared with the impedance shown in FIG. 3B, these impedances have different characteristics.

From this, it is found that the impedance to be converted by the carrier-side output matching circuit 10 and the impedance to be converted by the harmonic processing circuit 33 are combined with each other, resulting in a combined impedance having the characteristics as shown in FIG. 4A.

As described above, since the first feeder line 31 is connected to the carrier-side output matching circuit 10, the load impedance at the harmonic frequency viewed from the carrier amplifier 4 can be adjusted by the impedance at the harmonic frequency set in the first harmonic processing circuit 33. As a result, harmonic processing can be appropriately performed.

Example

Hereinafter, an example of a harmonic processing circuit will be described.

As an example, an amplifier including an amplifying device that amplifies an RF signal having a frequency of 3.8 GHz, a fundamental wave matching circuit connected to an output end of the amplifying device, and a harmonic processing circuit, is assumed. Regarding this amplifier, an example of impedance setting for the fundamental wave matching circuit and the harmonic processing circuit will be described.

Firstly, characteristics relating to saturated power and efficiency of the amplifying device used in the example are comprehended through load pull measurement. Based on the measurement result, a target impedance to be converted by the fundamental wave matching circuit and the harmonic processing circuit is specified.

Figure 5A:
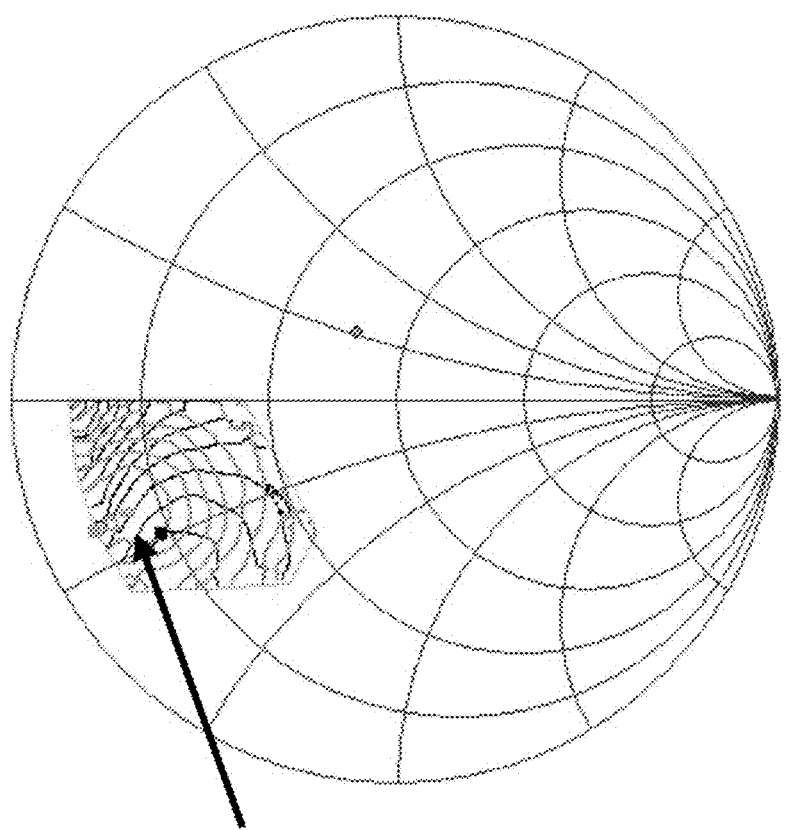
FIG. 5A shows a measurement result of characteristics relating to saturated power and efficiency with respect to a fundamental wave in the amplifying device.

FIG. 5A shows the measurement result of the characteristics relating to the saturated power and the efficiency with respect to the fundamental wave in the amplifying device. In FIG. 5A, isograms showing the measurement result relating to the saturated power and the efficiency are superimposed on a part of the Smith chart. Of the isograms, isograms indicated by thick lines represent the saturated power, and isograms indicated by faint lines represent the efficiency.

The isograms shown in FIG. 5A are images, and numerical values and the like to be indicated by the isograms are omitted.

Based on the isograms of the saturated power and the isograms of the efficiency superimposed on the Smith chart, a point on the Smith chart at which the saturated power and the efficiency are the highest is specified as a target impedance regarding the fundamental wave frequency.

In this example, a point indicated by an arrow in FIG. 5A is the target impedance regarding the fundamental wave frequency.

The magnitude (Mag) of the impedance at the point indicated by the arrow in FIG. 5A is 0.77, and the phase angle (Ang) is −155 degrees. Therefore, the target phase angle of the fundamental wave frequency is set to −155 degrees.

Figure 5B:
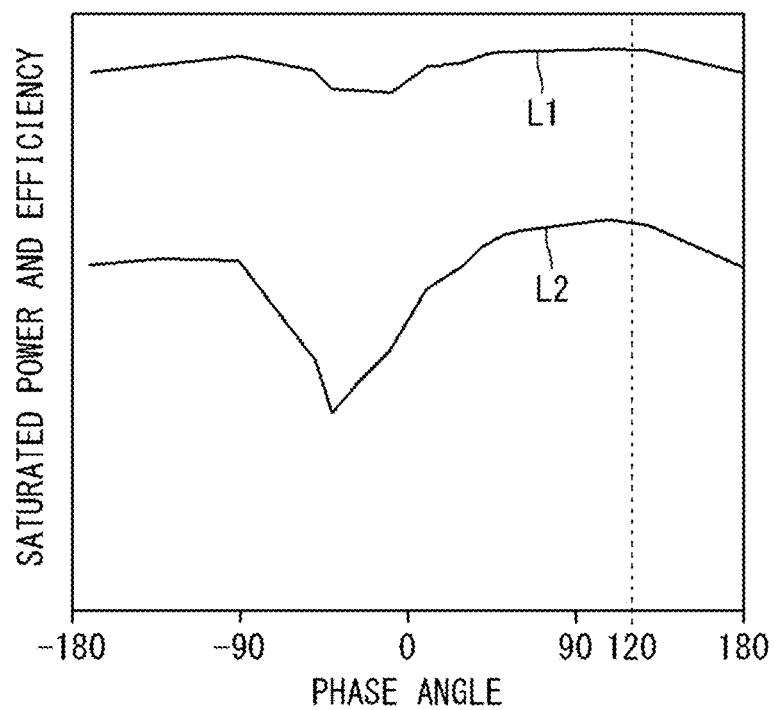
FIG. 5B is a graph showing a measurement result of characteristics relating to saturated power and efficiency with respect to a second harmonic in the amplifying device.

FIG. 5B is a graph showing the measurement result of the characteristics relating to the saturated power and the efficiency with respect to the second harmonic in the amplifying device.

In FIG. 5B, the horizontal axis indicates the phase angle, and the vertical axis indicates the magnitudes of the saturated power and the efficiency. In FIG. 5B, a line L1 represents the saturated power, and a line L2 represents the efficiency.

Based on this graph, a phase angle at which the saturated power and the efficiency were the highest is specified as a target phase angle of the second harmonic frequency.

Both the saturated power and the efficiency are at high levels when the phase angle is 120 degrees. Therefore, the target phase angle of the second harmonic frequency is set to 120 degrees.

Next, a fundamental wave matching circuit and a harmonic processing circuit for implementing the target phase angle are designed, and impedances of the designed circuits are obtained through a simulation using a computer and evaluated.

Figure 6A:
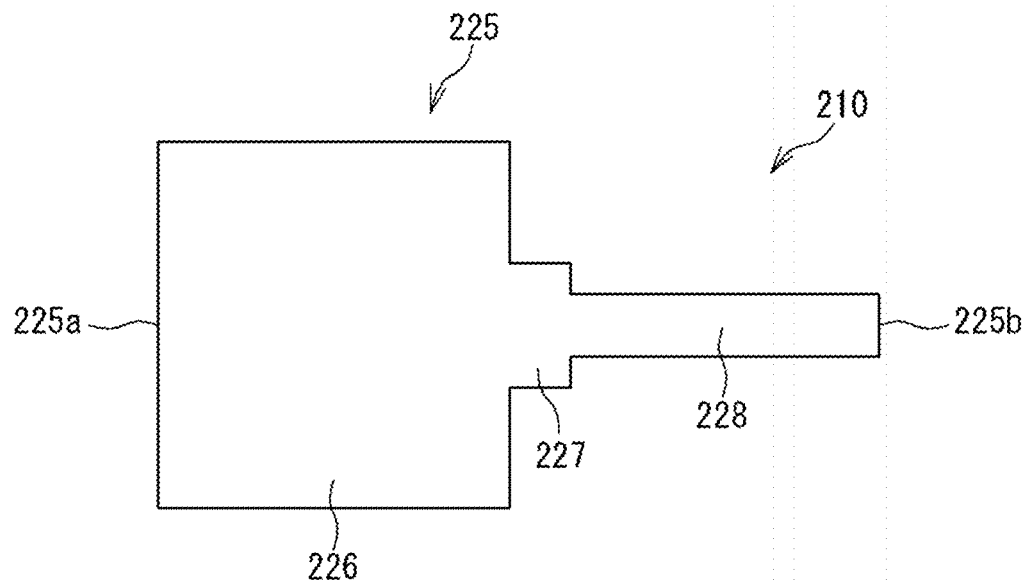
FIG. 6A shows only a fundamental wave matching circuit used as an example.

FIG. 6A shows only the fundamental wave matching circuit used for the example.

In FIG. 6A, a fundamental wave matching circuit 210 includes a signal line 225 having one end 225a to be connected to the amplifying device. The signal line 225 is configured to include: a wide portion 226 having the largest line width; a narrow portion 228 having the smallest line width and including the other end 225b to which a load or the like is connected; and an intermediate portion 227 connecting the wide portion 226 and the narrow portion 228.

The fundamental wave matching circuit 210 shown in FIG. 6A is designed such that the phase angle of the impedance with respect to the fundamental wave frequency is about −155 degrees which is the target phase angle while the impedance with respect to the second harmonic frequency is not particularly considered.

Figure 6B:
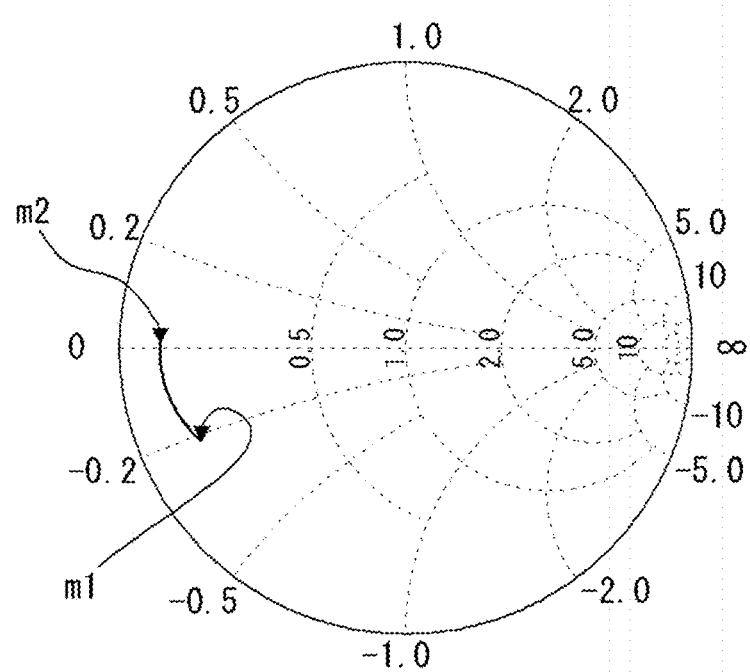
FIG. 6B is a Smith chart showing an impedance when one end of the fundamental wave matching circuit shown in FIG. 6A is viewed from the amplifying device in a case where the one end of the fundamental wave matching circuit is connected to the amplifying device while a load of 50Ω is connected to the other end of the fundamental wave matching circuit.

FIG. 6B is a Smith chart showing an impedance when the one end 225a of the fundamental wave matching circuit 210 is viewed from the amplifying device, in a case where the one end 225a of the fundamental wave matching circuit 210 shown in FIG. 6A is connected to the amplifying device and a load of 50Ω is connected to the other end 225b.

In FIG. 6B, a marker m1 indicates an impedance at the fundamental wave frequency (3.8 GHz), and a marker m2 indicates an impedance at the second harmonic frequency (7.6 GHz).

The impedance indicated by the marker m1 has a Mag of 0.772 and an Ang of −155.353 degrees. The Ang is approximately the target phase angle as designed.

The impedance indicated by the marker m2 has a Mag of 0.844 and an Ang of 178.186 degrees, which means that the impedance is almost short-circuited.

In this case, if the harmonic processing circuit is connected to the output end of the amplifying device, the impedance at the second harmonic frequency when the fundamental wave matching circuit 210 is viewed from the connection portion of the harmonic processing circuit 233 will be almost short-circuited. Therefore, as described above, even if the impedance at the harmonic frequency in the harmonic processing circuit is changed, it may be difficult to adjust the load impedance at the harmonic frequency as viewed from the amplifying device to a desired value.

Figure 7A:
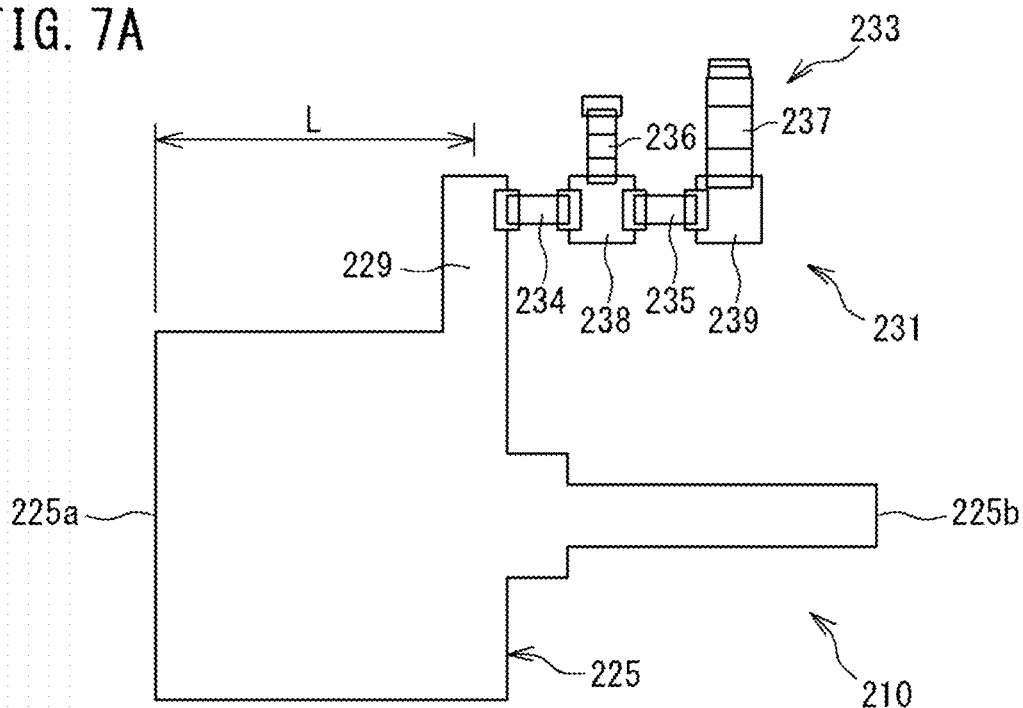
FIG. 7A shows a case where a harmonic processing circuit is connected to the fundamental wave matching circuit shown in FIG. 6A.

FIG. 7A shows a case where a harmonic processing circuit 233 is connected to the fundamental wave matching circuit 210 shown in FIG. 6A.

The harmonic processing circuit 233 shown in FIG. 7A has a configuration similar to that of the first harmonic processing circuit 33 shown in FIG. 2, and includes: a feeder line 231 that connects a DC power supply (not shown) connected to a connection portion 239, to the fundamental wave matching circuit 210; and elements constituting a harmonic processing unit.

The elements constituting the harmonic processing unit include a first inductance element 234, a second inductance element 235, a first capacitance element 236, and a second capacitance element 237. The first inductance element 234 and the second inductance element 235 are connected by a connection portion 238.

The first inductance element 234, the second inductance element 235, the first capacitance element 236, the second capacitance element 237, the connection portion 238, and the connection portion 239 correspond to the first inductance element 34, the second inductance element 35, the first capacitance element 36, the second capacitance element 37, the connection point 38, and the connection point 39 shown in FIG. 3, respectively.

A line 229 connecting the first inductance element 234 and the harmonic processing circuit 233 is a part of the feeder line 231, and connects the harmonic processing unit composed of the elements, to the harmonic processing circuit 233. The line 229 is connected to a position at which the line length from the one end 225a of the signal line 225 is a predetermined length L.

The predetermined length L is set to 5.2 mm in this example. Assuming that the wavelength of the fundamental wave is $\lambda$, the predetermined length L corresponds to $\lambda/8$.

The elements included in the harmonic processing circuit 233 are designed such that the phase angle of the impedance with respect to the second harmonic frequency is about 120 degrees which is the target phase angle.

Figure 7B:
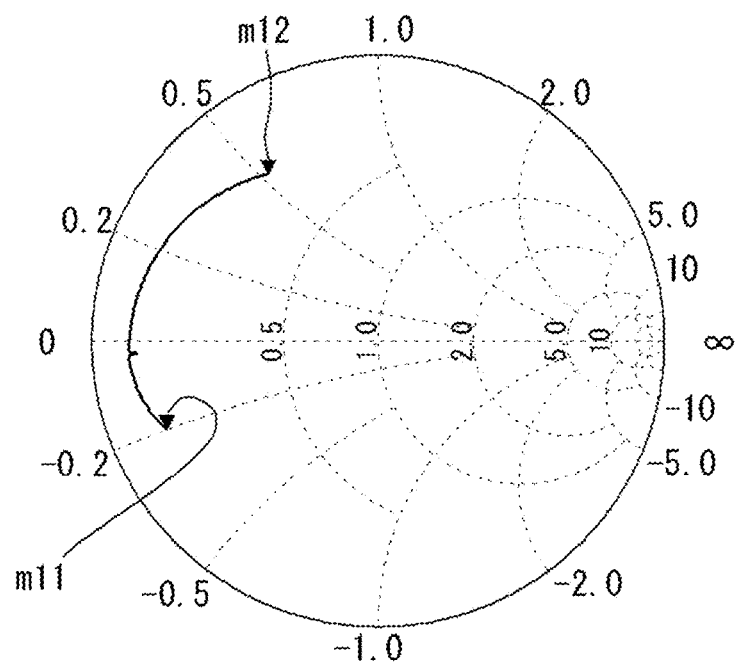
FIG. 7B is a Smith chart showing an impedance when one end of the fundamental wave matching circuit shown in FIG. 7A is viewed from the amplifying device in a case where the one end of the fundamental wave matching circuit is connected to the amplifying device while a load of 50Ω is connected to the other end of the fundamental wave matching circuit.

The values of the respective elements in this example are set as follows.

first inductance element: 1.3 nH
second inductance element: 3.0 nH
first capacitance element: 0.2 pF
second capacitance element: 5.1 pF FIG. 7B is a Smith chart showing an impedance when the one end 225a of the fundamental wave matching circuit 210 is viewed from the amplifying device, in a case where the one end 225a of the fundamental wave matching circuit 210 shown in FIG. 7A is connected to the amplifying device, and a load of 50Ω is connected to the other end 225b.

In FIG. 7B, a marker m11 indicates an impedance at the fundamental wave frequency (3.8 GHz), and a marker m12 indicates an impedance at the second harmonic frequency (7.6 GHz).

The impedance indicated by the marker m11 has a Mag of 0.778 and an Ang of −156.519 degrees. The Ang is approximately the target phase angle as designed.

The impedance indicated by the marker m12 has a Mag of 0.686 and an Ang of 122.231 degrees. The Ang is approximately the target phase angle as designed.

As described above, according to the example, both the phase angle of the impedance with respect to the fundamental wave frequency and the phase angle of the impedance with respect to the second harmonic frequency are the target phase angles, thereby appropriately adjusting the impedances.

That is, even in the case where it is difficult to adjust the load impedance at the harmonic frequency as viewed from the amplifying device if the fundamental wave matching circuit 210 and the harmonic processing circuit 233 are connected to the output end of the amplifying device, it is possible to appropriately adjust the load impedance at the harmonic frequency by connecting the harmonic processing circuit 233 to the fundamental wave matching circuit 210 as in this example.

More specifically, the feeder line 231 included in the harmonic processing circuit 233 is connected to a position at which the line length from the one end 225a of the signal line 225 is the predetermined length L. Therefore, the impedance at the harmonic frequency when the other end side of the signal line 225 is viewed from the connection portion of the feeder line 231, can be adjusted so as not to be short-circuited, by changing the predetermined length L to adjust the position of the connection portion of the feeder line 231. As a result, the load impedance at the harmonic frequency can be appropriately adjusted.

Although the predetermined length L is $\lambda/8$ in the above example, the predetermined length L may be not shorter than $\lambda/16$ and not longer than $3\lambda/16$.

Thus, for example, the phase angle of the impedance at the harmonic frequency when the other end side of the signal line 225 is viewed from the connection portion of the feeder line 231, can be changed by about 180 degrees with respect to the impedance at the harmonic frequency when the signal line 225 is viewed from the amplifying device.

Therefore, it is possible to reliably perform an adjustment such that the impedance at the harmonic frequency when the other end side of the signal line 225 is viewed from the connection portion is not short-circuited.

Others

Note that the embodiment disclosed herein is merely illustrative in all aspects and should not be recognized as being restrictive.

For example, assuming that the wavelength of the fundamental wave is $\lambda$, the line length of the first line 21 is set within the range not shorter than $\lambda/16$ and not longer than $3\lambda/16$. However, the present disclosure is not limited thereto, and the line length may be outside the range of the numerical values as long as appropriate harmonic processing can be performed.

In the example, the predetermined length L is set to $\lambda/8$. However, like the line length of the first line 21, the numerical value of the predetermined length L is not particularly limited as long as appropriate harmonic processing can be performed. However, the predetermined length L within the range not shorter than $\lambda/16$ and not longer than $3\lambda/16$ enables appropriate adjustment such that the impedance at the harmonic frequency when the other end 225b side of the signal line 225 is viewed from the connection portion of the line 229 is not short-circuited.

Although the Doherty amplifier 1 has been described in the above embodiment, an amplifier using a package that houses a single amplifying device may be used.

In the above embodiment, the first harmonic processing unit 32 is configured by connecting two stages of LC circuits. However, more stages, such as three stages or four stages, of LC circuits may be connected. For example, two stages of LC circuits being connected enables harmonic processing up to a second harmonic, and three stages of LC circuits being connected enables harmonic processing up to a third harmonic. Thus, the number of stages of LC circuits to be connected is set according to the order of the harmonic to be processed.

In the above embodiment, the first harmonic processing unit 32 in which the elements 34, 35, 36, and 37 are implemented by lumped elements, has been described. However, a part or all of the elements may be implemented by distributed elements.

The scope of the present disclosure is defined by the scope of the claims rather than by the meaning described above, and is intended to include meaning equivalent to the scope of the claims and all modifications within the scope.

The above-described Doherty amplifier 1 is mounted on a wireless communication apparatus such as a base station apparatus in a mobile communication system, and amplifies a radio-frequency transmission signal (RF signal). That is, the carrier amplifier 4 and the peak amplifier 5 included in the Doherty amplifier amplify a radio-frequency transmission modulation signal, which is obtained by modulating a radio-frequency carrier wave by using transmission data.

Therefore, the above description includes the characteristics as follows.

Additional Note

A harmonic processing circuit including:
a feeder line configured to feed power to an amplifying device; and
a harmonic processing unit connected to the feeder line, and configured to perform harmonic processing at a harmonic frequency of a radio-frequency transmission modulation signal outputted from the amplifying device, wherein
the feeder line is connected to a fundamental wave matching circuit that is connected to the amplifying device and performs matching at a fundamental wave frequency of the transmission modulation signal.

REFERENCE SIGNS LIST

1 Doherty amplifier
2 input terminal
3 output terminal
4 carrier amplifier
5 peak amplifier
6 distributor
7 combiner
8 carrier-side input matching circuit
9 peak-side input matching circuit
10 carrier-side output matching circuit
11 peak-side output matching circuit
12 package 21 first line
21a one end
21b the other end
22 second line
22a one end
23 connection portion
25 circuit board
30 first drain power supply
31 first feeder line
32 first harmonic processing unit
33 first harmonic processing circuit
34 first inductance element
35 second inductance element
36 first capacitance element
37 second capacitance element
38 connection point
39 connection point
40 second drain power supply
41 second feeder line
42 second harmonic processing unit
43 second harmonic processing circuit
51 first LC circuit
52 second LC circuit
60 first gate power supply
61 third feeder line
70 second gate power supply
71 fourth feeder line
100 amplifying device
102 fundamental wave matching circuit
102a terminal
104 feeder line
106 DC power supply
108 harmonic processing unit
108a terminal
110 connection portion
210 fundamental wave matching circuit
225a one end
225 signal line
226 wide portion
227 intermediate portion
228 narrow portion
225b the other end
229 line
231 first feeder line
233 first harmonic processing circuit
234 first inductance element
235 second inductance element
236 first capacitance element
237 second capacitance element
238 connection point
239 connection point

The invention claimed is:

1. A harmonic processing circuit comprising:
a feeder line configured to feed power to an amplifying device; and
a harmonic processing unit connected to the feeder line, and configured to perform harmonic processing at a harmonic frequency of a signal outputted from the amplifying device, wherein
the feeder line is connected to a fundamental wave matching circuit that is connected to the amplifying device and performs matching at a fundamental wave frequency of the signal,
the fundamental wave matching circuit includes a first line having one end connected to the amplifying device, and a second line connected to the other end of the first line,
the feeder line is connected to a connection portion that connects the first line and the second line, and
assuming that a wavelength of a fundamental wave of the signal is $\lambda$, the first line has a line length not shorter than $\lambda/16$ and not longer than $3\lambda/16$.

2. A harmonic processing circuit comprising:
a feeder line configured to feed power to an amplifying device; and
a harmonic processing unit connected to the feeder line, and configured to perform harmonic processing at a harmonic frequency of a signal outputted from the amplifying device, wherein
the feeder line is connected to a fundamental wave matching circuit that is connected to the amplifying device and performs matching at a fundamental wave frequency of the signal,
the fundamental wave matching circuit includes a signal line having one connected to the amplifying device,
the feeder line is connected to a position in the signal line whose line length from the one end of the signal line is a predetermined length, and
assuming that a wavelength of a fundamental wave of the signal is $\lambda$, the predetermined length is not shorter than $\lambda/16$ and not longer than $3\lambda/16$.

* * * * *